United States Patent
Worley

(10) Patent No.: US 6,365,951 B1
(45) Date of Patent: Apr. 2, 2002

(54) METHODS ON CONSTRUCTING AN AVALANCHE LIGHT EMITTING DIODE

(76) Inventor: Eugene Robert Worley, 11 Bowditch, Irvine, CA (US) 92620

( * ) Notice: Subject to any disclaimer, the term of this patent is extended or adjusted under 35 U.S.C. 154(b) by 0 days.

(21) Appl. No.: 09/375,769

(22) Filed: Aug. 17, 1999

Related U.S. Application Data

(60) Provisional application No. 60/096,399, filed on Aug. 13, 1998.

(51) Int. Cl.[7] .............................................. H01L 31/107
(52) U.S. Cl. ........................... 257/438; 257/79; 257/88; 257/98; 257/101; 257/103; 257/199; 257/443; 257/461; 250/214 R; 250/214 LA; 250/214 VT; 313/499; 313/500
(58) Field of Search .............................. 257/79, 88, 89, 257/98, 101, 103, 199, 438, 443, 461; 250/214 VT, 214 LA, 214 R; 313/499, 500

(56) References Cited

U.S. PATENT DOCUMENTS

| | | | | |
|---|---|---|---|---|
| 4,683,483 A | * | 7/1987 | Burnham et al. ............. 357/13 |
| 4,991,150 A | * | 2/1991 | Wixom ........................ 367/140 |
| 5,107,311 A | * | 4/1992 | Tsukamoto et al. ............ 357/17 |
| 5,331,180 A | * | 7/1994 | Yamada et al. ................. 257/3 |
| 6,034,419 A | * | 3/2000 | Nicholls et al. ............. 257/641 |
| 6,103,564 A | * | 8/2000 | Masuda ....................... 438/237 |

* cited by examiner

Primary Examiner—Olik Chaudhuri
Assistant Examiner—Wai-Sing Louie

(57) ABSTRACT

Methods of laying out avalanche light emitting diodes (LEDs) are described in which a heavily impurity doped region of one type of polarity, a second, lighter doped region of like polarity, and a heavy doped region of opposite type polarity are disposed in a silicon substrate. Electrodes are laid out such that light emitted by the avalanching PN junction is not blocked. Construction features include shallow implants to improve efficiency and implants which avoid the silicon-oxide interface for stability and implants which avoid junction corners to avoid concentrating injection. Construction of vertical and side emitting junctions are disclosed. Also disclosed are construction details of side emitting SOI junctions which are useful in SOI based opto couplers.

29 Claims, 7 Drawing Sheets

Fig. 4B  Fig. 4C

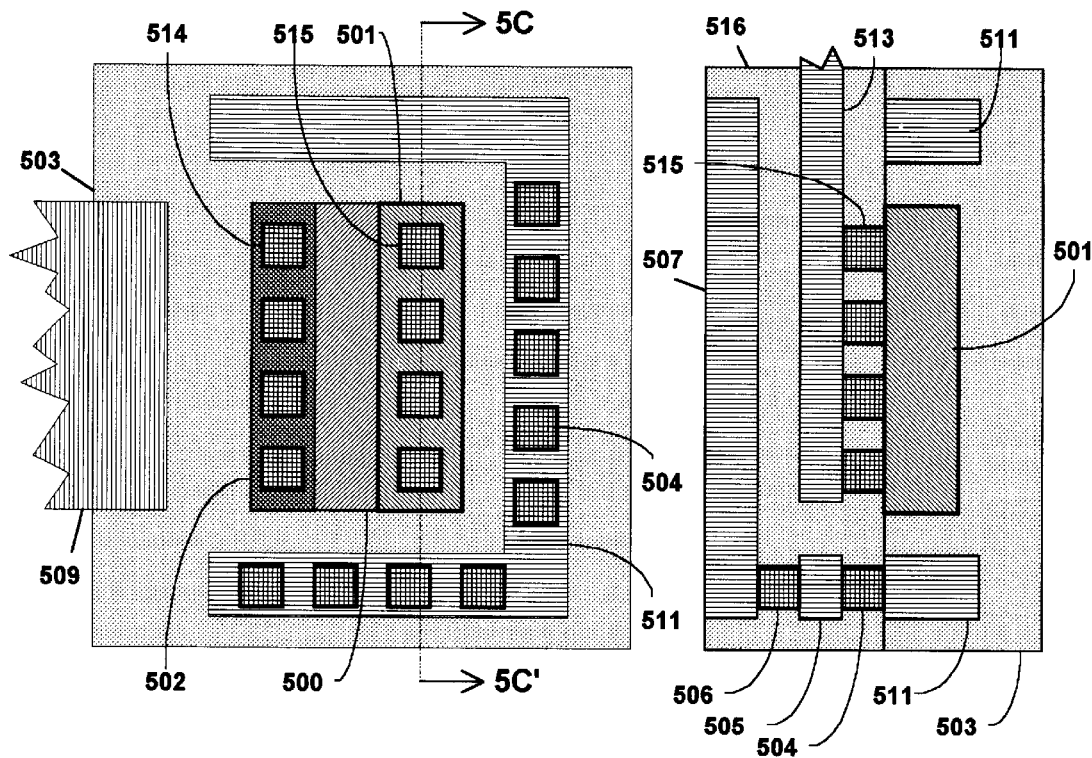
Fig. 5B
Fig. 5C
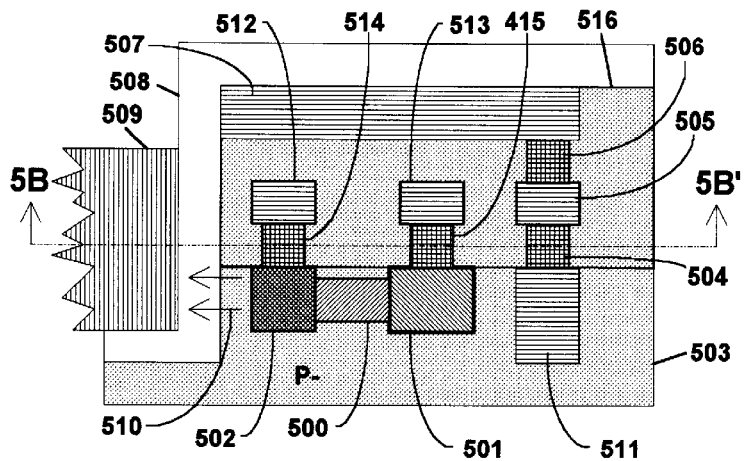
Fig. 5A

METHODS ON CONSTRUCTING AN AVALANCHE LIGHT EMITTING DIODE

This application claims benefit of Prov. No. 60/096,399 filed Aug. 13, 1998.

BACKGROUND OF THE INVENTION

1. Field of the Invention

This invention is directed to an avalanche Light Emitting Diode which can be realized in silicon using a PN junction.

2. Prior Art

It is well known that an avalanching junction produces light. In particular, silicon PN junctions operated in the avalanche or breakdown mode produce visible light. However, when compared to the efficiency of a GaAs based LED, silicon PN junction diodes operated in the avalanche mode are quite inefficient. However, as pointed out in U.S. Pat. No. 5,438,210, even an inefficient silicon based LED can be useful in opto-coupler applications, especially if it can be integrated with standard silicon components. A monolithic opto-coupler is inherently lower in cost than a hybrid opto coupler which employs a separate GaAs based LED and a separate silicon detector.

Ideally, the integrated LED should be realized using standard silicon processing and be reliable. One silicon based LED, the porous silicon LED, requires processing steps different from normal silicon integrated circuit process steps and may have reliability issues. However, PN junction diodes operated in the avalanche mode can be made with standard silicon processing and are known to be reliable.

In one study it was shown that the light output from an avalanching silicon diode is very linear with current and has essentially a temperature coefficient of 0 when driven by a current source. Thus, an avalanche LED is amenable to linear applications without feedback being required. The study also determined that the quantum efficiency is 2e-5 which is high enough to make practical opto-couplers in applications were power is availible to amplify the light detector signal.

SUMMARY OF THE INSTANT INVENTION

It is the objective of the this invention to show methods of constructing an avalanche PN junction diode which optimizes its light output and is stable over time. This is accomplished by judicious placement of doping implants relative to electrodes, electrode construction, and construction of light reflecting mirrors. Two types of diodes are considered including a vertical junction avalanche diode and an edge avalanche diode. In the case of the edge avalanche diode, the heavy implant region corresponding to the avalanche zone must be placed somewhat below the surface so that hot carrier injection into the passivating thick field oxide is avoided. A second version of the edge avalanche LED is also shown in which an SOI substrate is used.

PRIOR ART STATEMENT

A. Lacaita, F. Zappa, S. Bigliardi, and M. Manfredi, "On the Bremsstrahlung Origin of Hot-Carrier-Induced Photons in Silicon Devices", IEEE Trans. Electron Devices, vol. ED-40, p.577, 1993.

PRIOR ART STATEMENT

BRIEF DESCRIPTION OF THE DRAWINGS

FIG. 4B shows the top cut away view of the annular vertical junction avalanche LED.

FIG. 4C shows a side cross section view of the annular Vertical junction avalanche LED.

FIG. 5A shows a cross section of an edge junction avalanche LED with fiber optical cable connection and light reflecting metal surfaces used to concentrate light.

FIG. 5B shows the top cut away view of the edge junction avalanche LED of FIG. 5A.

FIG. 5C shows a side cross section view of the edge junction avalanche diode of FIG. 5B.

DESCRIPTION OF THE PREFERRED EMBODIMENT

Figures 1B, 1C:
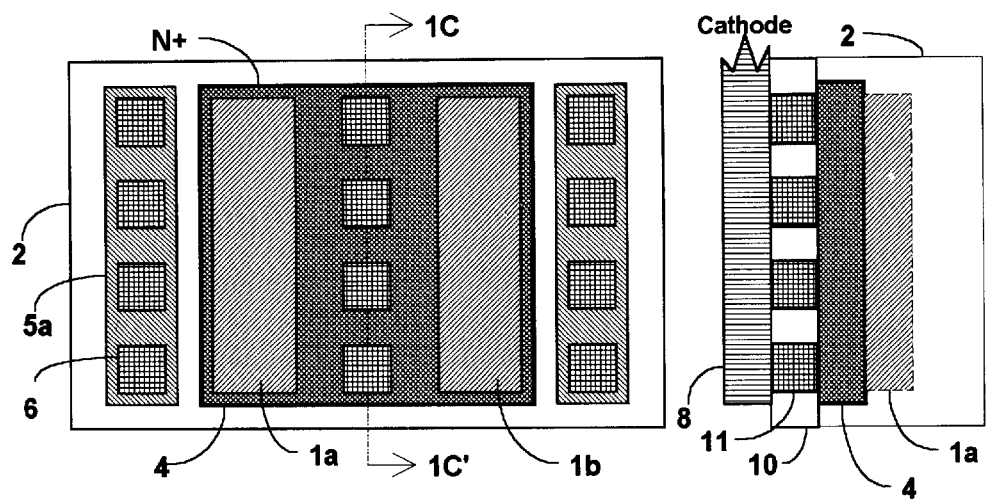
FIG. 1B is a top cut away view of the vertical junction avalanche LED of FIG. 1A.
FIG. 1C is a side cross section of the vertical junction avalanche LED of FIG. 1B.

FIG. 1 shows 3 views of the preferred embodiment of a vertical junction avalanche LED.

Figure 1A:
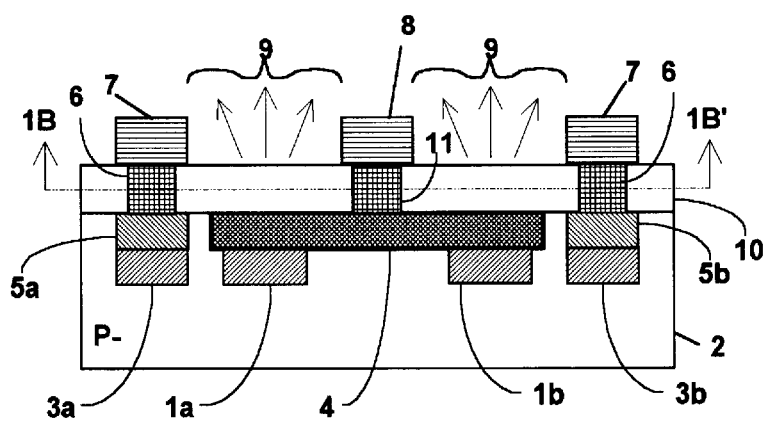
FIG. 1A is a cross section of a vertical junction avalanche LED in a P substrate.

FIG. 1 A shows a cross section view of the junctions associated with the avalanche diode. 2 is the bulk substrate which is assumed to be P doped silicon, 4 is the N+ junction used to form a contact with interconnecting metal and to form one side of the junction of the avalanche diode, 1 is a P type implanted region which is used as the second side of the junction of the avalanche diode, 3 is a P type implanted region formed at the same time as 1, and 5 is a P+ region used to make contact with interconnect metal and can be the same as the implant used to make the P+ junctions associated with the drain-source regions of P type MOSFETs or a junction associated with a bipolar transistor. In this example, the interconnect is comprised of tungsten plugs 6 and 11 and standard IC metal interconnect 7 and 8 such as aluminum with barrier metals. Also shown is the interlevel dielectric 10 which is made of optically transparent $Sio_2$. Therefore, the N+ region 4 forms the cathode of the avalanche diode and the P implanted regions 1 form the anode. Note that the implanted P regions 1 are more heavily doped than the background P doping of the substrate 2. Thus, the avalanching zone is confined to the intersection of the implanted P regions 1 and the N+ region 4. The P implant is also applied to the region 3 of the P+ implant 5 to help lower parasitic resistance in the anode. In this example tungsten plugs 6 are used to make contact to the P+ implant regions 5 and a tungsten plug 11 is used to contact the N+ implant region 4. Metal interconnect is shown for the anode 7 and for the cathode 8. It should be noted that other contact arrangements can be used such as the so called "champagne glass" shaped contact with metal directly contacting the P+ implanted regions 5 and the N+ region 4. Not shown are guard bands such as N+ in N well bands which are used to prevent minority carriers from spreading out from the diode. The N+4 can be the same implant as that used to make the drain-source regions of N type MOSFETs or that used to make the junction of a bipolar transistor. Note that the P implanted regions 1 are well within the bottom area of the N+ implanted region 4. This is done to promote junction uniformity. In particular, the implanted P regions should avoid the corners of the N+ implanted region 4 because of the concentration of the electric field at the corners. The width of the P implanted regions 1 of FIG. 1A is determined by the debiasing caused by resistance of the P regions 1 and the P substrate resistance. A smaller component of debiasing resistance is associated with the N+ implanted region 4. Since the light emitted from the junction of the P 1 and N+4 regions must pass through the N+ implant region 4 the depth of the N+ implant 4 should be made as small as possible. Note also that the electrodes 7 and 8 are located away from the light emitting junctions of 1 and 4 so that the electrodes do not block the light path from the junctions to the surface of the semiconductor.

For the sake of as low an operating voltage as possible, the P implant regions 1 are doped to levels of $2\times10^{17}/cm^3$ or higher so that the avalanche voltage is low. Typically, substrates are doped well below this value which allows the avalanching region defined by the junction of the N+ implant 1 and the P implant 4 to be, for practical purposes, unaffected by the substrate doping. As long as the background doping is lower than the P implant regions 1, the avalanching action will occur only at the junction of implanted regions 1 and 4. Also, the junction of implants 4 and 1 should be made as abrupt as possible since a high electric field improves light emission efficiency.

Figure 1D:
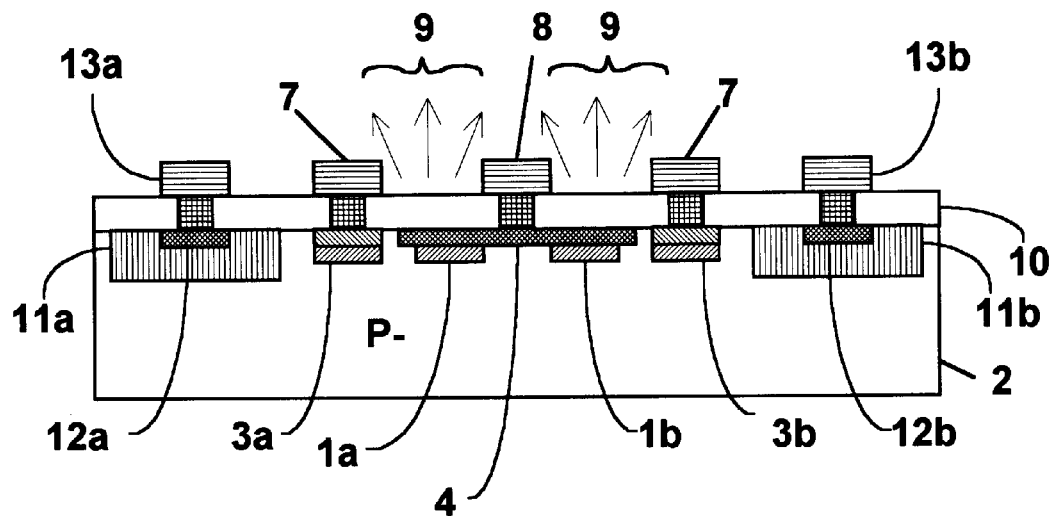
FIG. 1D shows an expanded cross section view of FIG. 1C which r reveals the carrier collecting guard bands.

Unfortunately, a component of light is emitted into the silicon. To prevent this light contamination from interfering with other adjacent on chip devices such as transistors it is necessary to place said devices far enough away from the LED such that the effect light has on these devices is negligible. A key factor in determining this distance is the absorption of light by silicon which is dependent on the wavelength of the light. To determine the wavelength of light emitted by a silicon junction in the avalanche mode a common bipolar transistor, the 2N2222 packaged in a "can", was used where the top of the "can" was filed away thereby exposing the silicon chip. The transistor's base-emitter junction was reversed biased into the avalanche mode by a current source. The resulting light emission was observed to be yellow. For a yellow light the absorption coefficient is about ½μm in silicon. At 15 μm distance, the light intensity in silicon is less than $1/1000^{th}$ of that at the LED junction. Hole-electron pairs generated in the substrate can be collected by reversed biased junctions placed around the LED. FIG. 1D shows an expanded cross section of the LED of FIG. 1C with the minority carrier collecting guard bands surrounding the LED. The carrier collecting guard bands include an N well 11, an N+ implant 12 for contact between metal and the N well 11, and the metal terminal 13 which goes to the positive power supply terminal.

Figure 2:
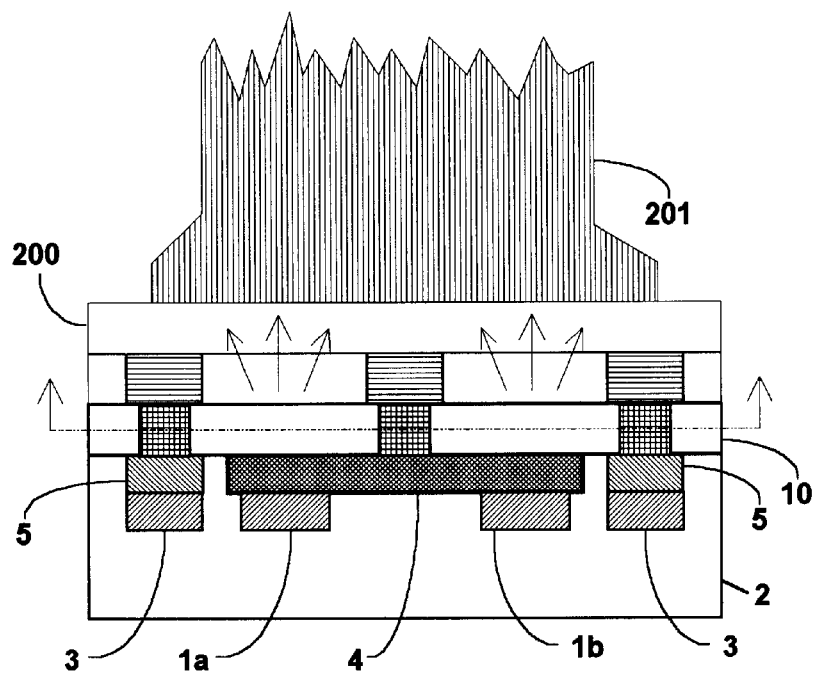
FIG. 2 is a cross section of the vertical junction avalanche LED showing a fiber optic cable connection.

FIG. 2 shows a cross section of the vertical avalanche junction LED with a connecting fiber optic cable 201. Note that the cable is connected directly above the light emitting junctions comprising the N+ implant 4 and the P implants 1. A transparent passivating layer 200 exists between the interlevel dielectric 10 and the cable 201. Normally the top of the passivating layer is silicon nitride which is transparent.

Figure 3:
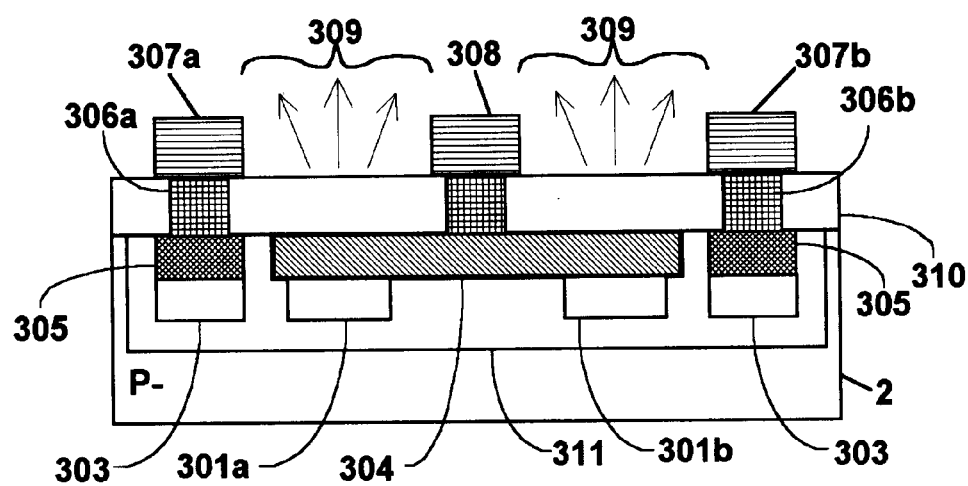
FIG. 3 shows a cross section of a vertical junction avalanche LED formed in an N type Well which is in a P type substrate.

FIG. 3 shows a cross section of an avalanche junction LED similar to that of FIG. 1 except that the polarities of the implants associated with the light emitting junction are reversed. In this case a P substrate 2 is still assumed but an N implant is used to create an N well 311 within the P substrate as is typically done for P channel transistors in a CMOS process. The shallow, heavily doped implant associated with the LED is a P+ implant 304 and the lighter doped implant is N type 301. The junction of the P+ implant 304 and the N implant 301 constitutes both the avalanche zone and the light emitting region of the silicon LED. Implant 305 is an N+ implant and is used to make contact to interconnect which includes tungsten plugs 306 and metal connection lines 307. The same N type implant used to make the implants 301 is also used make the implants 303 which are used to lower parasitic diode resistance. Metal lines 307 constitute the cathode connection and the metal line 308 the anode connection. Light 309 emitted from the junction of implants 301 and 304 is shown as it leaves the transparent interlevel dielectric layer 310.

For a vertical avalanche LED to be realized in an N type substrate, the implant polarities of FIG. 1 are merely reversed. That is, for an N type substrate 2, implant 4 is a heavy P type, implant 1 is lighter N type, and implant 5 is a heavy N type. Correspondingly, for the case of a P well in an N type substrate, the polarities of the implants of FIG. 3 will be reversed. That is, implant 304 is heavy P type, implant 301 is somewhat lighter N type, 305 is heavy N type, and 311 is a P type well.

Figure 4A:
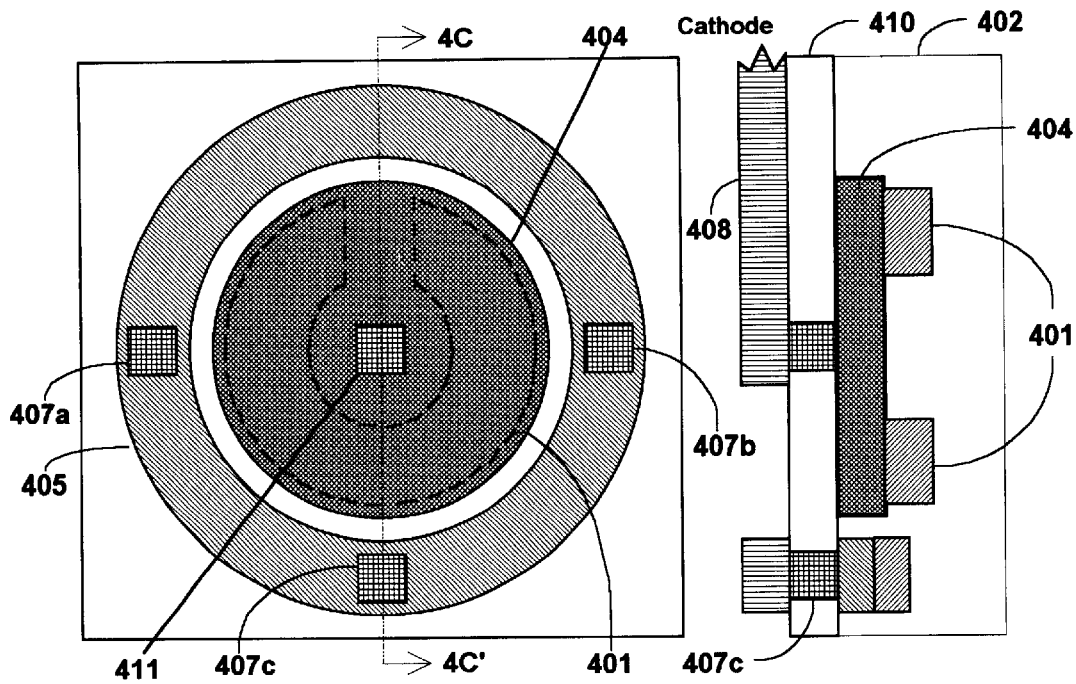
FIG. 4A shows a cross section of a vertical junction avalanche LED which is an annular version of that of FIG. 3.
Figure 4A:
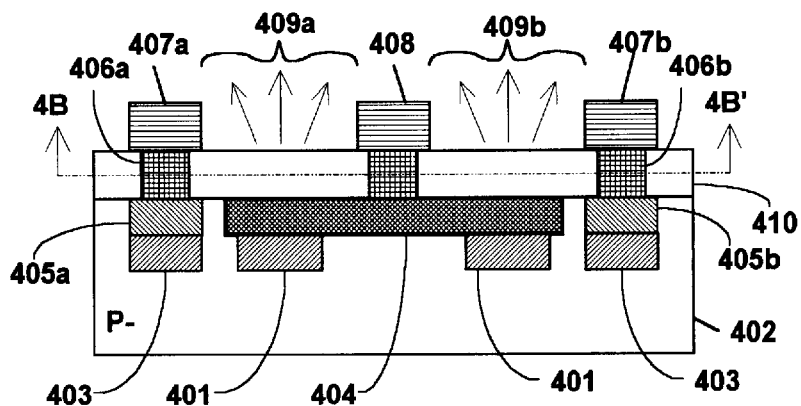

FIG. 4 shows an example of an annular layout of the vertical junction avalanche LED. FIG. 4A shows a cross section of the annular LED with a P type substrate 402. The N+ implant region 404 forms one side of the avalanching junction and P type implant region 401 forms the other side of the avalanching junction. The intersection of these junctions forms the light emitting zone. Light 409 is emitted through the transparent interlevel dielectric between the metal terminals 407 and 408. The center metal, 408, forms the terminal for the cathode of the LED and 407 forms the terminal for the anode. The connection to the anode junction is made via the substrate 402, the P type doping layer 403 which is made with the same implant step as 401, a P+ implant 405, and a tungsten plug 406. A tungsten plug 411 is used to connect to the cathode N+404 to the metal terminal 408.

In the top view of FIG. 4B it can be seen that there are 3 contacts or tungsten plugs, 407a, 407b, and 407c. Note that it is possible to place more contacts around the P+ ring 405. A gap 412 in the P implant ring 401 is observed at the top. This gap is where the metal line 408 brings power to the cathode of the LED as shown in FIG. 4C. Thus, there is no light emitting junction under this metal interconnect line.

FIG. 5A shows a cross section of side or edge emitting LED in which the signal light is emitted parallel to the die surface. Assuming a P type substrate 503, the LED junction is formed at the junction of an N+ implant region 502 and a somewhat lighter P type implant region 500 which has a significantly higher impurity concentration than the substrate 503. Note that the P implant region 500 exists slightly below the silicon 503/oxide 516 interface and somewhat above the bottom corner of the N+ implant region 502.

Keeping the P implant region 500 below the silicon/oxide interface prevents hot electrons from being injected into the oxide thereby causing charge to become trapped in the oxide which can cause shifts in the avalanche characteristic over time. Keeping the P implant region 500 above the bottom corner of the N+ implant region 502 prevents a concentration of current flow at the corner due to the geometric enhancement of the electric field at the corner.

A P+ implant region 501 is used to make electrical contact between the P implant region 500 and the tungsten plug 515. The interconnect metal 513 brings power to the LED anode. A tungsten plug 514 connects the cathode of the LED to metal interconnect 512.

A trench is etched into the silicon so that a fiber optic cable 509 can be placed directly in front of the emitted light 510. A trench is also etched into the silicon substrate 503 on the three sides that exclude the fiber optic cable and are used to reflect stray light back toward the fiber optic cable. In this diagram, metal 511 is used to fill the trench. Further light reflecting barriers include a tungsten plug 504, metal interconnect 505, another tungsten plug 506, and a top cap layer of metal 507. These reflecting structures will either reflect stray light toward the fiberoptic cable or toward the substrate 503 bulk.

FIG. 5B shows a top cut away view of the side emitting diode. The trench metal 511 is seen on the three aforementioned sides. Note that the plugs 504 appear on only two of the sides. This is done since the anode 513 and cathode 512 metal lines exit on side where there are no tungsten plugs 504. If the plugs 504 were present on the top side of the trench metal 511 they would connect the anode 513 and cathode 512 metal to the trench metal 511 which is undesirable.

FIG. 5C is a side view of the side emitting diode. In this view the cathode 502 connection is detailed where the cathode connecting metal 512 is contacted to the cathode implant 502 via plugs 514. As mentioned before, a "champagne glass" style contact that dispenses with tungsten plugs 514 and uses the metal 512 directly can also be used.

Note that the polarities of the implants used in the description of the side emitting LED can be reversed.

The side emitting diode is probably most useful in SOI avalanche light emitting diodes. Because of SOI's dielectric isolation between on chip devices, monolithic opto couplers can be realized. Thus, both the LED and the detector can reside on one chip while providing dielectric isolation between the two devices. For ease of coupling, side emitting LEDs and side receiving detectors are desirable.

Figure 6B:
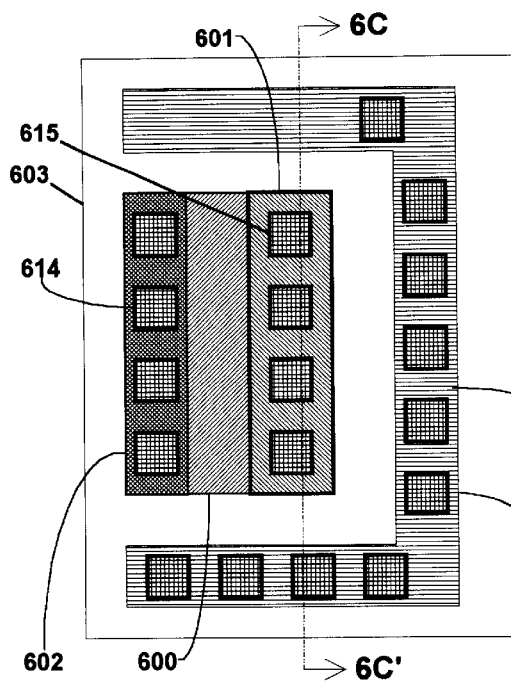
FIG. 6B shows the top cut away view of the edge junction avalanche LED on SOI of FIG. 6A.
Figure 6C:
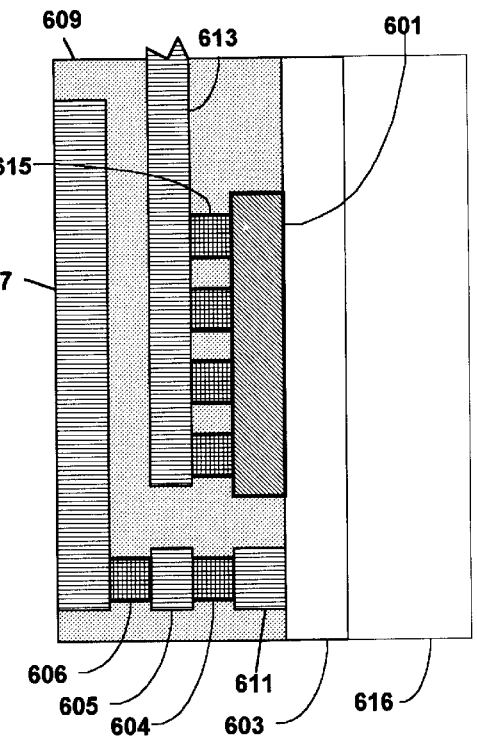
FIG. 6C show a side cross section view of the edge junction avalanche diode on SOI of FIG. 6B.
Figure 6A:
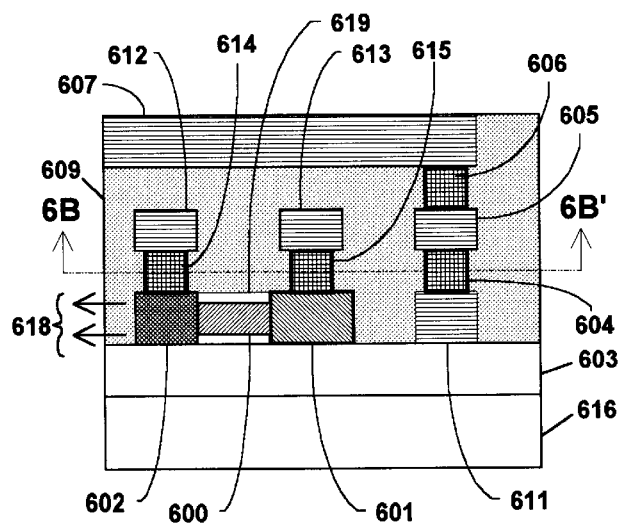
FIG. 6A shows the cross section of and edge junction avalanche LED on SOI.

FIG. 6A shows a cross section of a side emitting LED realized on an SOI substrate. The insulator 603 is typically SiO$_2$ and the substrate 616 silicon. For some SOI materials such as SOS the substrate is an insulator. In this diagram there exists a silicon island 619 with three different implanted regions including an P+ region 601, a P region 600, and an N+ region 602. Light emission occurs at the junction of the P region 600 and the N+ region 602. Note that the P implant 600 is peaked at the center of the silicon film 619. This is done to avoid hot electron injection into the top oxide 609 and the bottom oxide 603 by making the avalanche voltage higher at the insulator-silicon interfaces. The width of the N+ region should be made as small as possible since the silicon of the N+ region will absorb light. Light 618 is emitted from the junction after passing through the N+ region 602. An IC wave guide can be placed at this end of the junction in order to direct light to an on chip detector not shown. Tungsten plug 614 is used to connect the cathode or N+ region 602 to the metal interconnect 612. Similarly, tungsten plug 615 connects the anode or the P+ region 601 which electrically connects to the P region 600 to the metal interconnect 613.

A light reflecting shield is also place around the LED to aid in directing stray light away from other circuit components which may be present on the chip and to help direct stray light toward the desired light emission area 618. The light shield is comprised of a stack containing metal 1 or first metal line 611, a first tungsten plug 604, a second metal line 605, a second tungsten plug 605, and a third metal cap layer 607 which covers the top of the LED. Note that other processing approaches are possible depending on the metal/contact scheme used. For example, the LED covering metal 607 can be a second level metal with a "champagne glass" style direct contact to a metal I layer which is in contact with the substrate insulator 603 and would correspond to metal 611 in FIG. 6A. Thus, a "champagne glass" contact region would replace the tungsten 604/metal 605/tungsten 606 stack.

FIG. 6B shows a cut away top view of the SOI side emitting LED. Metal 611 is used as a side reflector and runs along 3 sides of the LED. Note that at the top of the mirrored "C" shape of metal 611 there is only one tungsten plug of type 604 present. This is the side were the anode terminal 613 and the cathode terminal 612 bring power to the LED.

FIG. 6C shows a side view of the SOI side emitting LED. Note the anode metal interconnect 613 that exits from the view ultimately goes to a power source. A series of tungsten plugs are seen contacting the P+ implant region 601 with the anode metal interconnect 613. Also seen in this view are the light containment/reflector elements 611, 604, 605, 606, and the top metal cover 607.

An SOI avalanche LED can also be realized in which the polarities of implants are reversed. That is, the P+ implant region 601 becomes an N+ region, the P implant region 600 becomes an N region, and the N+ implant region 602 becomes a P+ implant.

Figure 6D:
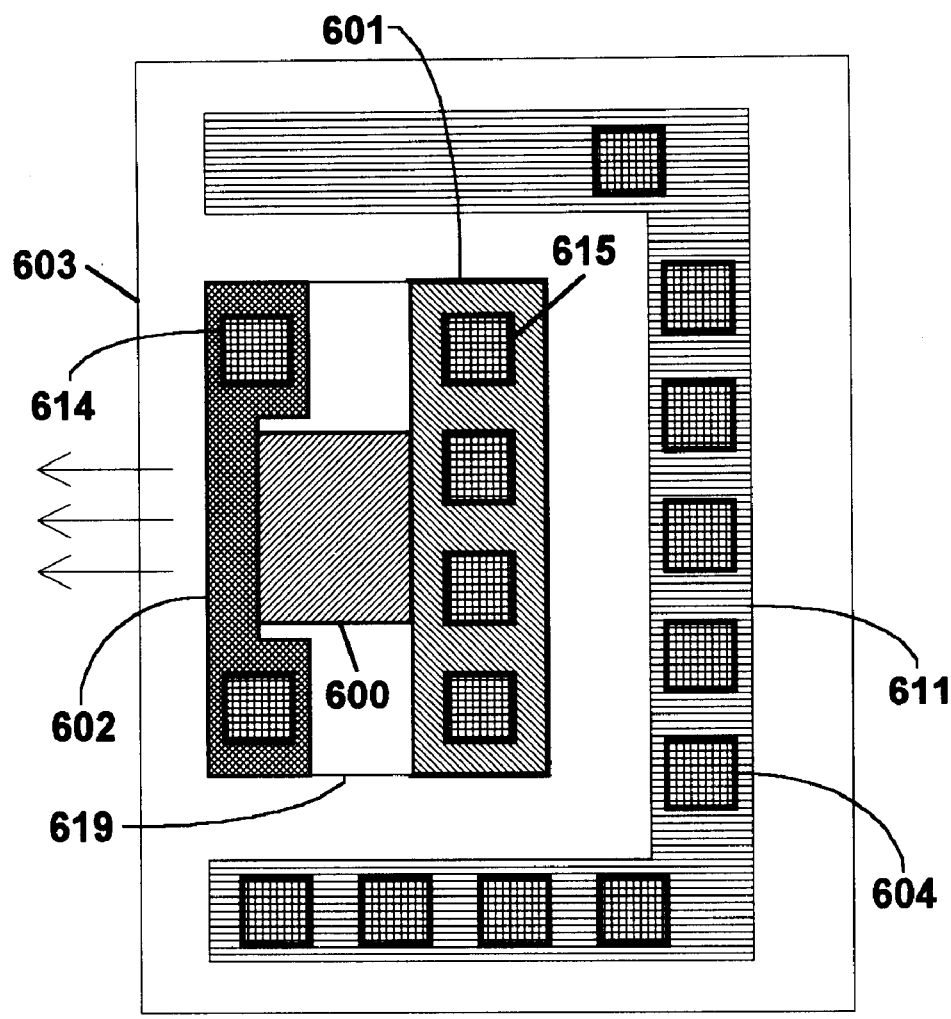
FIG. 6D show a top view variation of the edge junction avalanche diode on SOI in which the N+ cathode region is not contacted to improve light emission efficiency.

FIG. 6D shows another method of laying out an SOI side emitting avalanche LED. Since the width of an implant region can be typically defined to be smaller than a contact it is possible to reduce the silicon absorption of light by having the light emitting junction or avalanching junction in contact with a narrow, heavily doped region without contacts. Note that in FIG. 6D the uncontacted N+ implant region 602 is narrower than the contacted region. Also note that the P region 600 is in contact with the implanted N+ region only in the zone were the N+ region is uncontacted. This arrangement allows higher efficiency by making the N+ region through which light must pass smaller. The down side is a larger layout area per given light emitting junction area and somewhat more lateral cathode resistance. Note that the P implant 600 is kept away from the corner of the N+ implant region associated with the contact. Again, this is done to prevent edge enhanced field effects which can cause undesirable current crowding.

I claim:

1. An avalanche light emitting diode comprising:
    a p-type silicon substrate;
    a layer of optically transparent oxide formed on the substrate;
    a pn junction formed in the substrate;
    the pn junction comprising,
        an N+ region forming one side of the junction; and
        a p-type implanted region beneath the N+ region forming the other side of the junction, wherein the N+ region and the p-type implanted region are non-porous silicon;

a light emitting avalanching zone confined to the intersection of the N+ region and the p-type implanted region; and a plurality of P+ implanted regions spaced away from the junction.

2. The avalanche light emitting diode of claim 1, wherein the p-type implanted region beneath the N+ region is formed away from the corners of the N+ region.

3. The avalanche light emitting diode of claim 2 further comprising a cathode contact including at least one tungsten plug in the oxide connected to the N+ region and an anode contact including at least one tungsten plug in the oxide connected to each one of the P+ implanted regions.

4. The avalanche light emitting diode of claim 2 further comprising a cathode contact including at least one metal contact in the oxide connected to the N+ region and an anode contact including at least one metal contact in the oxide connected to each one of the P+ implanted regions.

5. The avalanche light emitting diode of claim 3 further comprising a metal interconnect connected to each one of the tungsten plugs in the anode contact wherein the metal interconnect is spaced away from an area directly above the light emitting avalanching zone.

6. The avalanche light emitting diode of claim 5 further comprising a transparent passivating layer formed on the transparent oxide layer, and a fiber optic cable connected to the surface of the passivating layer for collecting light emitted by the pn junction.

7. An avalanche light emitting diode comprising:

a p-type silicon substrate;

a optically transparent oxide layer formed on the substrate;

an N well formed in the substrate;

pn junction formed within the N well;

the pn junction comprising,
 a P+ region forming one side of the junction; and
 an n-type implanted region beneath the P+ region forming the other side of the junction, wherein the P+ region and the n-type implanted region are non-porous silicon;

a light emitting avalanching zone confined to the intersection of the P+ region and the n-type implanted region; and a plurality of N+ implanted regions in the N well spaced away from the junction.

8. The avalanche light emitting diode of claim 7, wherein the n-type implanted region beneath the P+ region is formed away from the corners of the P+ region.

9. The avalanche light emitting diode of claim 8 further comprising a cathode contact including at least one tungsten plug in the oxide connected to each one of the N+ implanted regions and an anode contact including at least one tungsten plug in the oxide connected to the P+ region.

10. The avalanche light emitting diode of claim 9 further comprising a metal interconnect connected to each one of the tungsten plugs in the cathode contact wherein the metal interconnect is spaced away from an area directly above the light emitting avalanching zone.

11. The avalanche light emitting diode of claim 10 further comprising a transparent passivating layer formed on the transparent oxide layer, and a fiber optic cable connected to the surface of the passivating layer for collecting light emitted by the pn junction.

12. An edge avalanche light emitting diode comprising:

a p-type silicon substrate;

a optically transparent oxide layer formed on the substrate;

a pn junction formed in the substrate;

the pn junction comprising,
 an N+ region forming one side of the junction; and
 a p-type implanted region adjacent to one side of the N+ region forming the other side of the junction wherein the p-type region is formed below the oxide layer, and the N+ region and the p-type region are non-porous silicon;

a light emitting avalanching zone confined to the intersection of the N+ region and the p-type implanted region; and a P+ implanted region adjacent to a side of the p-type region opposite the N+ region.

13. The avalanche light emitting diode of claim 12 further comprising a cathode contact including at least one tungsten plug in the oxide connected to the N+ region and an anode contact including at least one tungsten plug in the oxide connected to the P+ implanted region.

14. The avalanche light emitting diode of claim 13 further comprising a second oxide layer formed beneath the pn junction.

15. The avalanche light emitting diode of claim 13 further comprising a first trench etched into the substrate and parallel to the side of the N+ region opposite the p-type implanted region.

16. The avalanche light emitting diode of claim 15 further comprising a second trench etched around three sides of the pn junction, wherein the second trench is filled with metal for reflecting light towards the first trench.

17. The avalanche light emitting diode of claim 16 further comprising a fiber optic cable placed in the first trench for collecting light emitted parallel to the surface of the substrate.

18. A light emitting diode comprising:

a p-type silicon substrate;

a layer of optically transparent oxide formed on the substrate;

a pn junction formed in the substrate;

the pn junction comprising,
 an N+ region forming one side of the junction; and
 a p-type implanted region beneath the N+ region forming the other side of the junction, the p-type region being more heavily doped than the substrate, wherein the N+ region and the p-type implanted region are non-porous silicon;

a metal interconnect layer on the transparent oxide layer and electrically connected to the N+ region, wherein the metal interconnect layer does not substantially overlap the p-type implanted region; and a light emitting avalanching zone confined to the intersection of the N+ region and the p-type implanted region.

19. The light emitting diode of claim 18, wherein the metal interconnect layer substantially overlaps the N+ region.

20. The light emitting diode of claim 19 further comprising at least one tungsten plug in the oxide layer connected between the metal interconnect layer and the N+ region.

21. The light emitting diode of claim 18 further comprising:

a plurality of P+ regions spaced away from the junction; and a second metal interconnect layer on the transparent oxide and electrically connected to the plurality of P+ regions, wherein the second metal interconnect layer does not substantially overlap the p-type implanted region.

22. The light emitting diode of claim 18, wherein the p-type implanted region beneath the N+ region is formed away from every corner of the N+ region.

23. The light emitting diode of claim 18 further comprising a fiber optic cable positioned above and substantially overlapping the p-type implanted region.

24. A light emitting diode comprising:

a p-type silicon substrate;

a optically transparent oxide layer formed on the substrate;

an N well formed in the substrate;

a pn junction formed within the N well;

the pn junction comprising, a P+ region forming one side of the junction; and an n-type implanted region beneath the P+ region forming the other side of the junction, wherein the P+ region and the n-type are non-porous silicon;

a metal interconnect layer on the transparent oxide layer and electrically connected to the P+ region, wherein the metal interconnect layer does not substantially overlap the n-type implanted region; and a light emitting avalanching zone confined to the intersection of the P+ region and the n-type implanted region.

25. The light emitting diode of claim 24, wherein the metal interconnect layer substantially overlaps the P+ region.

26. The light emitting diode of claim 25 further comprising at least one tungsten plug in the oxide layer connected between the metal interconnect layer and the P+ region.

27. The light emitting diode of claim 24 further comprising:

a plurality of N+ regions spaced away from the junction; and a second metal interconnect layer on the transparent oxide and electrically connected to the plurality of N+ regions, wherein the second metal interconnect layer does not substantially the n-type implanted region.

28. The light emitting diode of claim 24, wherein the n-type implanted beneath the P+ region is formed away from every corner of the P+ region.

29. The light emitting diode of claim 24 further comprising a fiber optic cable positioned above and substantially overlapping the n-type implanted region.

* * * * *